United States Patent
Tatoh et al.

(10) Patent No.: US 6,600,223 B2
(45) Date of Patent: Jul. 29, 2003

(54) HERMETICALLY SEALING ENCLOSURE FOR HOUSING PHOTO-SEMICONDUCTOR DEVICES AND PHOTO-SEMICONDUCTOR MODULE INCORPORATING THE ENCLOSURE

(75) Inventors: Nobuyoshi Tatoh, Itami (JP); Koji Nishi, Itami (JP); Shinya Nishina, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/178,520

(22) Filed: Jun. 25, 2002

(65) Prior Publication Data

US 2003/0001259 A1 Jan. 2, 2003

(30) Foreign Application Priority Data

Jun. 27, 2001 (JP) ........................................ 2001-194457

(51) Int. Cl.⁷ ................................................ H01L 23/06
(52) U.S. Cl. ........................ 257/729; 257/690; 257/692; 257/693
(58) Field of Search ................................. 257/729, 703, 257/502, 678, 683, 704–706, 718–719, 723, 726, 727, 730, 732, 690–693; 361/715, 729

(56) References Cited

U.S. PATENT DOCUMENTS 5,907,185 A    5/1999   Tatoh
6,163,072 A   12/2000   Tatoh
6,220,765 B1   4/2001   Tatoh
6,345,917 B2   2/2002   Tatoh
6,440,778 B1 *  8/2002   Okada et al. ................ 257/693

FOREIGN PATENT DOCUMENTS

JP         11-145317       5/1999

* cited by examiner

Primary Examiner—David Nelms
Assistant Examiner—Andy Huynh
(74) Attorney, Agent, or Firm—McDermott, Will & Emery

(57) ABSTRACT

A hermetically sealing enclosure for housing photo-semiconductor devices that reduces the heat generated in the wiring strips at the ceramic terminal member, increases the allowable current of the wiring strips in comparison with the conventional enclosures while maintaining the low power consumption, and stabilizes the output of the device in the enclosure. A photo-semiconductor module incorporating the enclosure is also offered. The ceramic terminal member is provided with a first wiring layer that comprises a plurality of wiring strips and that penetrates through the ceramic terminal member; two second wiring layers each of which comprises at least one wiring strip, one of which is connected to the first wiring layer at the outside of the enclosure, and the other of which is connected to the first wiring layer at the inside; and at least one third wiring layer that comprises at least one wiring strip and that connects the two second wiring layers.

24 Claims, 4 Drawing Sheets

HERMETICALLY SEALING ENCLOSURE FOR HOUSING PHOTO-SEMICONDUCTOR DEVICES AND PHOTO-SEMICONDUCTOR MODULE INCORPORATING THE ENCLOSURE

BACKGROUND OF THE INVENTION

1. Field of the Invention

The present invention relates to a hermetically sealing enclosure for housing photo-semiconductor devices and other related devices (hereinafter collectively referred to as photo-semiconductor devices). More specifically, it relates to a hermetically sealing enclosure for housing electronic devices (such as optical devices, optical fiber amplifiers equipped with semiconductor ICs, and excitation light sources) that require electrode terminals to have a current-carrying capacity at least two times that of the conventional devices. It further relates to a photo-semiconductor module incorporating the enclosure.

2. Description of the Background Art

FIG. 6 shows a typical example of a conventional hermetically sealing enclosure for housing photo-semiconductor devices. The enclosure comprises (a) a metal base plate 1 that is made of a copper-tungsten alloy and that has at the central portion of its top side an area for mounting photo-semiconductor devices, (b) a side-frame member 2 that is made of an iron-nickel-cobalt-family alloy and that is brazed on the metal base plate 1 such that it encloses the area for mounting photo-semiconductor devices, (c) a means for securely holding an optical fiber at the front side frame of the side-frame member, (d) ceramic terminal members 3 that are incorporated into the side-frame member and that are provided with metallized wiring strips onto which external leads 4 made of an iron-nickel-cobalt alloy are connected, and (e) a seal ring 5 that is brazed on the planar surface produced by the top surface of the ceramic terminal member 3 and the top surface of the side-frame member 2 to form a metal frame for hermetically sealing the enclosure.

The assembly of a photo-semiconductor module is usually completed as a unit by the following process using the above-described enclosure: (a) Electronic devices such as photo-semiconductor devices and thermoelectric coolers are mounted in an area for mounting these devices on the metal base plate. (b) The electrodes of these devices are connected by bonding wires to the metallized wiring strips to which the external leads are connected. (c) The optical fiber is bonded to an optical fiber-fixing ring at the front side frame of the side-frame member by yttrium-aluminum-garnet (YAG) laser beam welding. (d) A seal cover is placed on the top surface of the sealing ring to hermetically seal the enclosure.

The ceramic terminal member is formed by firing at least two laminated layers of ceramic preforms. The electrical continuity between the inside and outside of the enclosure can be provided by printing the metallized wiring strips on the surface of the ceramic preforms in advance. The metallized wiring strips are made of a high melting-point metal such as tungsten, molybdenum, or manganese.

The enclosure is required to have the following two principal features: (a) It must effectively dissipate the heat generated during the conversion of optical signals to electrical signals and vice versa. (b) It must have a particular structure such that its thermal distortion cannot cause misalignment in the optical axis between the optical fiber and the photo-semiconductor device. It is well known that in order to effectively dissipate the heat, a thermoelectric cooler is placed directly underneath the photo-semiconductor device, and highly heat-conductive materials are used for the members constituting the enclosure.

Such an enclosure and a photo-semiconductor module incorporating the enclosure have been disclosed, for example, by the published Japanese patent application Tokukaihei 11-145317. The enclosure disclosed in this application has the following structure to suppress the generation of thermal distortions. (a) The main body of the enclosure is formed by combining a metal base plate with a side-frame member having a front side frame at which a means for securely holding an optical fiber is provided. (b) Part of the upper portion of the side-frame member is cut out to provide a space for a ceramic terminal member that is composed of at least two ceramic layers and that is provided with metallized wiring strips. (c) The ceramic terminal member is placed in the space such that its one end in the longitudinal direction is in contact with the inner surface of the front side frame and its opposite end is exposed to produce a surface flush with the outer surface of the rear side frame. (d) A metal seal ring is placed on the planar surface produced by the top surface of the ceramic terminal member and the top surface of the side-frame member.

As described above, the heat dissipation of a hermetically sealing enclosure for housing photo-semiconductor devices thus far has been dependent on design concepts such as the selection of the constituting materials. Conventional enclosures have ceramic terminal members provided with metallized wiring strips having relatively high electrical resistance. This relatively high resistance causes insignificant problems because of the small amount of the heat generated by the current flowing the resistance. However, recent technical developments have increased the output of the laser diode (LD) for optical fiber amplifiers and excitation light sources. As a result, a thermoelectric cooler for cooling an LD requires an operating current at least two times that of the conventional cooler. In the conventional cooler, the current is at most about two amperes and generates a negligible amount of heat. However, the current increased by a factor of at least two generates a non-negligible amount of heat. More specifically, the increased current not only increases the power consumption but also increases the temperature rise in the metallized wiring strips to the extent that it cannot be neglected. This temperature rise in turn increases the resistance of the metallized wiring strips. This resistance increase has given rise to various problems such as causing difficulty in the operational controll of the thermoelectric cooler, the reliability reduction in the wiring strips, and the reduction in the optical output of the LD due to its heat transfer.

The electrical resistance of the wiring strips formed in the body of the ceramic material can be reduced by using a metal having an electrical conductivity higher than that of tungsten and other high melting-point metals. However, this method increases the difference in the coefficient of thermal expansion between the ceramic material and the wiring strips, posing a problem of crack generation in the ceramic material. The electrical resistance can also be reduced by increasing the thickness of the wiring strips. This method, however, produces gaps in the ceramic material at the time of the firing of the ceramic preforms, preventing complete hermetic sealing. The electrical resistance can also be reduced by increasing the width of each wiring strip formed both on the surface of the ceramic material and in the body of the ceramic material. However, it is difficult to increase the width sufficiently because of problems such as the poor insulation between the neighboring wiring strips and the reduction in the number of wiring strips.

SUMMARY OF THE INVENTION

In order to solve the above-described problems, an object of the present invention is to offer a hermetically sealing enclosure for housing photo-semiconductor devices that has the following features: (a) The electrical resistance of the metallized wiring strips provided at the ceramic terminal member is reduced. (b) The heat generated in the wiring strips is reduced. (c) The wiring strips allow a larger current to flow than that allowed by the conventional enclosures while maintaining low power consumption. (d) The stable output of the device inside the enclosure is maintained. Another object of the present invention is to offer a photo-semiconductor module incorporating the enclosure.

The hermetically sealing enclosure of the present invention has the following components:

(a) a base plate having an area for mounting photo-semiconductor devices;

(b) a side-frame member bonded on the base plate such that the side-frame member encloses the area for mounting photo-semiconductor devices;

(c) a ceramic terminal member incorporated into the side-frame member such that the top surface of the ceramic terminal member and the top surface of the side-frame member produce a planar surface;

(d) a first wiring layer that:
  (d1) comprises a plurality of wiring strips; and
  (d2) penetrates through the ceramic terminal member;

(e) a second wiring layer (hereinafter referred to as the second wiring layer) that:
  (e1) comprises at least one wiring strip;
  (e2) is connected to the first wiring layer on the outside of the ceramic terminal member; and
  (e3) stretches upward;

(f) another second wiring layer (hereinafter referred to as the other second wiring layer) that:
  (f1) comprises at least one wiring strip;
  (f2) is connected to the first wiring layer on the inside of the ceramic terminal member; and
  (f3) stretches upward;

(g) at least one third wiring layer that:
  (g1) comprises at least one wiring strip;
  (g2) connects the second wiring layer and the other second wiring layer;
  (g3) penetrates through the ceramic terminal member via a pathway insulated from the first wiring layer; and
  (g4) is insulated from the other third wiring layers when more than one third wiring layer is used;

(h) a means for securely holding an optical fiber, the means being provided on the side-frame member;

(i) a seal ring placed on the planar surface produced by the top surface of the ceramic terminal member and the top surface of the side-frame member;

(j) a sealing cover placed on the top surface of the seal ring; and (k) a plurality of external leads connected to the wiring strips in the first wiring layer at the outside of the enclosure.

In an embodiment of the present invention, the external leads include at least one external lead (hereinafter referred to as an external lead AA) having a thickness larger than the distance between the first wiring layer and the third wiring layer or the uppermost third wiring layer. The external lead AA or each external lead AA is connected to a wiring strip in the first wiring layer, the wiring strip being connected to a wiring strip in the second wiring layer. The external lead AA or each external lead AA is connected to the third or every third wiring layer.

In another embodiment, the external leads include at least one external lead (hereinafter referred to as an external lead BB) having the shape of the letter L. The external lead BB or each external lead BB is connected to a wiring strip in the first wiring layer, the wiring strip being connected to a wiring strip in the second wiring layer. The bent shorter portion of external lead BB or each external lead BB has a length larger than the distance between the first wiring layer and the third wiring layer or the uppermost third wiring layer and is connected to the third or every third wiring layer.

In yet another embodiment, the enclosure is provided with, at its inside, at least one metal part having the shape of the letter L. A bent portion of the metal part or each metal part is connected to a wiring strip in the first wiring layer, the wiring strip being connected to a wiring strip in the other second wiring layer. The remaining straight portion of the metal part or each metal part has a length larger than the distance between the first wiring layer and the third or the uppermost third wiring layer and is connected to the third or every third wiring layer.

The above-described external leads and metal parts having the shape of the letter L are made of oxygen-free copper, a copper matrix in which alumina is dispersed, or a clad material in which copper is sandwiched between iron-nickel-cobalt alloys.

The photo-semiconductor module of the present invention comprises the above-described hermetically sealing enclosure for housing photo-semiconductor devices.

DETAILED DESCRIPTION OF THE INVENTION

Figure 1:
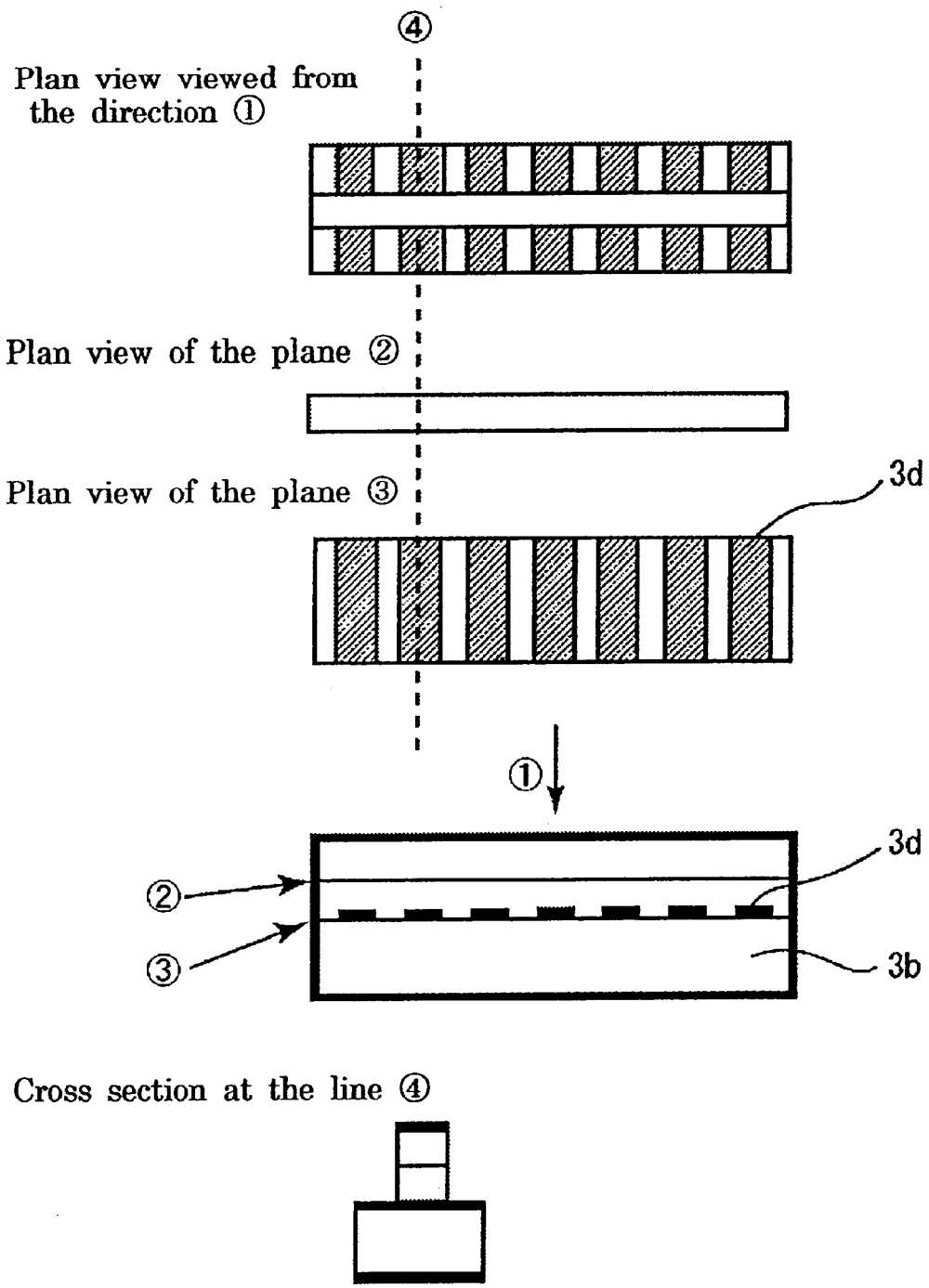
FIG. 1 is a developed view showing a conventional ceramic terminal member.

FIG. 1 shows the pattern of the wiring strips and the structure of the ceramic terminal member of a conventional hermetically sealing enclosure. As shown in FIG. 1, a plurality of wiring strips 3d are provided on a first ceramic layer 3b. The wiring strips 3d provide the electrical continuity between the outside and inside of the enclosure.

Figure 2:
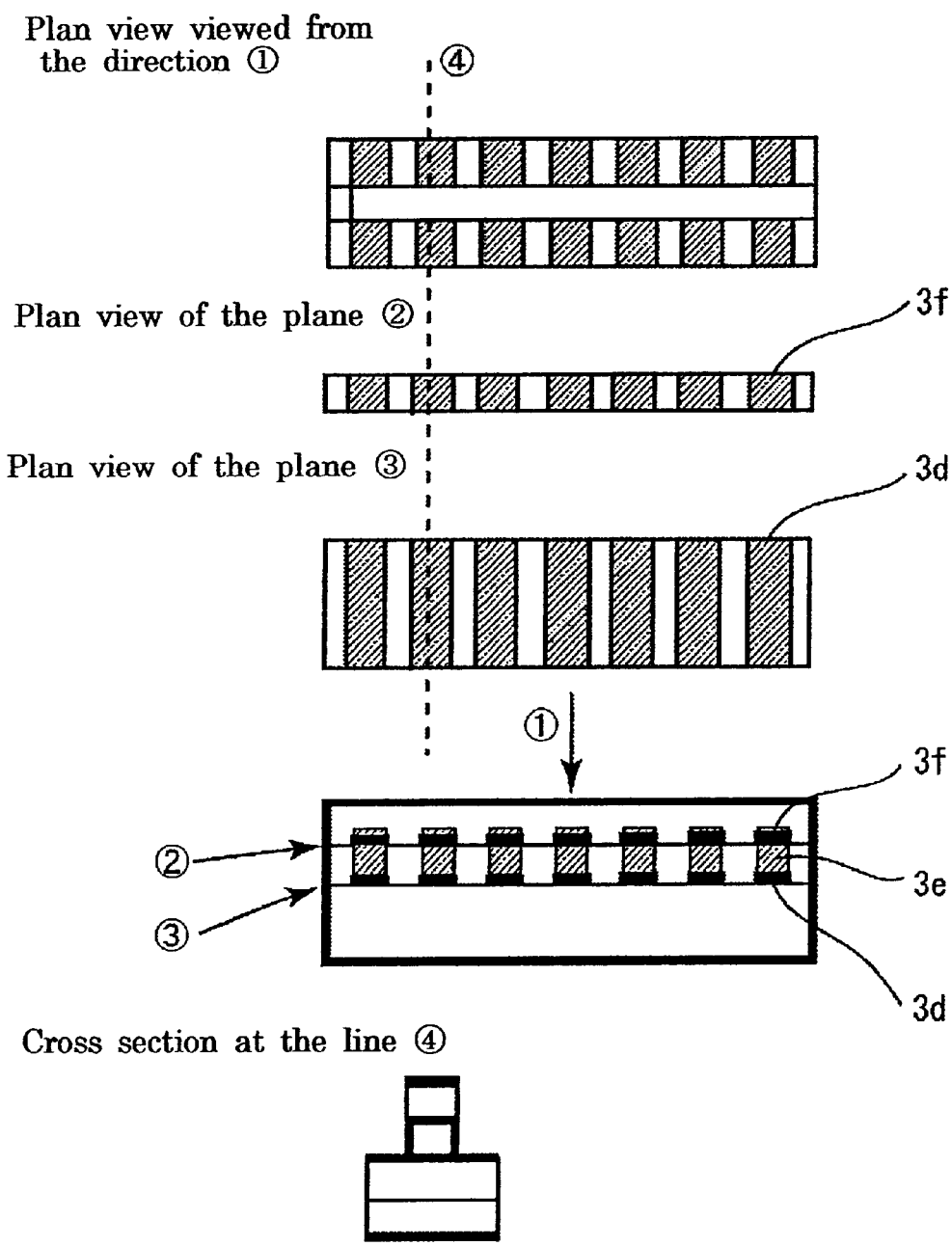
FIG. 2 is a view showing the developed ceramic terminal member of an embodiment of the present invention.

FIG. 2 shows the structure of the ceramic terminal member of an embodiment of the present invention. As with the conventional enclosure, wiring strips 3d (the first wiring layer) are provided on a first ceramic layer. The wiring strips 3d (the first wiring layer) are connected to wiring strips 3e (the second wiring layer) provided on the outside face of a second ceramic layer. The wiring strips 3e (the second wiring layer) in turn are connected to wiring strips 3f (the third wiring layer) provided on the top surface of the second ceramic layer. Then, the wiring strips 3f (the third wiring layer) are connected to the other wiring strips 3e (the other second wiring layer) provided on the inside face of the second ceramic layer. The other wiring strips 3e (the other second wiring layer) in turn are connected to the wiring strips 3d (the first wiring layer). In FIG. 2, the number of wiring strips in the two second wiring layers and the third wiring layer coincides with the number of wiring strips in the first wiring layer. However, the two second wiring layers and the third wiring layer are not necessarily required to have the same number of wiring strips as that in the first wiring layer. They are required to have at least one wiring strip in their respective layers, depending on the current ratings of the devices housed in the enclosure.

Although FIG. 2 shows the third wiring layer comprising a single wiring layer, the third wiring layer may comprise a plurality of wiring layers mutually insulated by a ceramic layer. This structure provides at least one third wiring layer connected in parallel to the first wiring layer through the two second wiring layers. In other words, the electrical continuity between the outside and inside of the enclosure is provided by a plurality of wiring circuits connected in parallel. As a result, the total wiring resistance can be reduced from the value obtained by the conventional method. (As described above, the conventional method provides electrical continuity solely by a single wiring circuit provided on the first ceramic layer.) The reduced wiring resistance can suppress the amount of heat generated by the above-described increased current.

Figure 3:
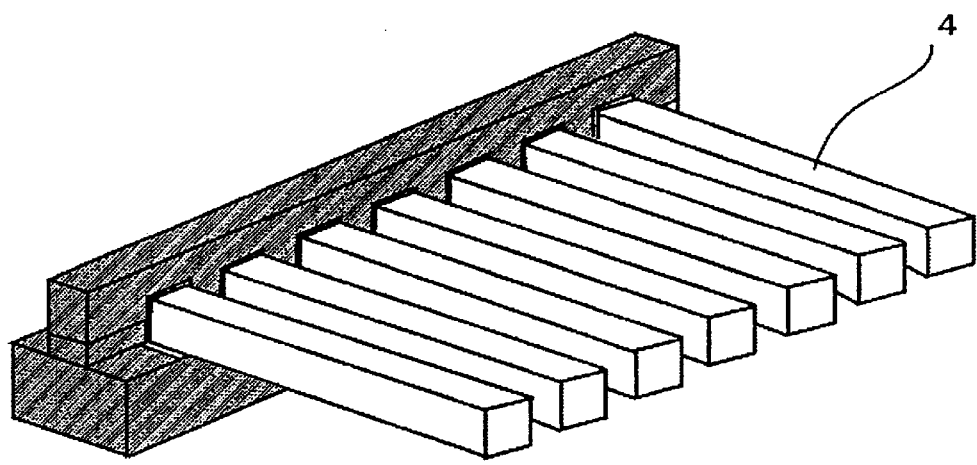
FIG. 3 is a perspective view showing the ceramic terminal member and the external leads of an embodiment of the present invention.

When the current is increased, even the resistance of the two second wiring layers can cause a problem. In order to reduce the resistance of the second wiring layer provided on the outside face of the enclosure, it is desirable that the external leads 4 have a specific thickness to enable the external leads 4 to reach the third wiring layer, as shown in FIG. 3, and to allow the external leads 4 to be connected to the third wiring layer. When the third wiring layer comprises a plurality of wiring layers, the external leads 4 are required to have a thickness to allow the leads to reach the uppermost third wiring layer to be connected to every third wiring layer. In FIG. 3, all the wiring circuits penetrating through the ceramic terminal member have wiring strips in the third wiring layer, and accordingly all the external leads 4 have the increased thickness. However, the number of wiring circuits having wiring strips in the third wiring layer varies among the enclosures, as described above. Therefore, the number of external leads having the increased thickness coincides with the number of wiring strips in the third wiring layer.

Figure 4:
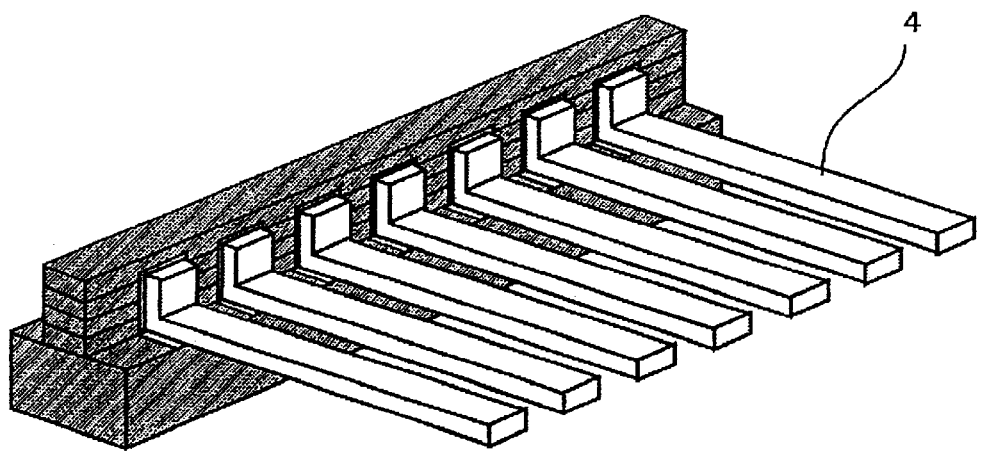
FIG. 4 is a perspective view showing the ceramic terminal member and the external leads of another embodiment of the present invention.

As shown in FIG. 4, the external leads 4 may have the shape of the letter L to enable the bent shorter portion of each external lead to reach the uppermost third wiring layer to be connected to every third wiring layer. As in FIG. 3, all the wiring circuits in FIG. 4 have wiring strips in the third wiring layer, and all the external leads 4 have the shape of the letter L. However, as explained above, the number of external leads having the shape of the letter L coincides with the number of wiring strips in the third wiring layer.

Figure 5:
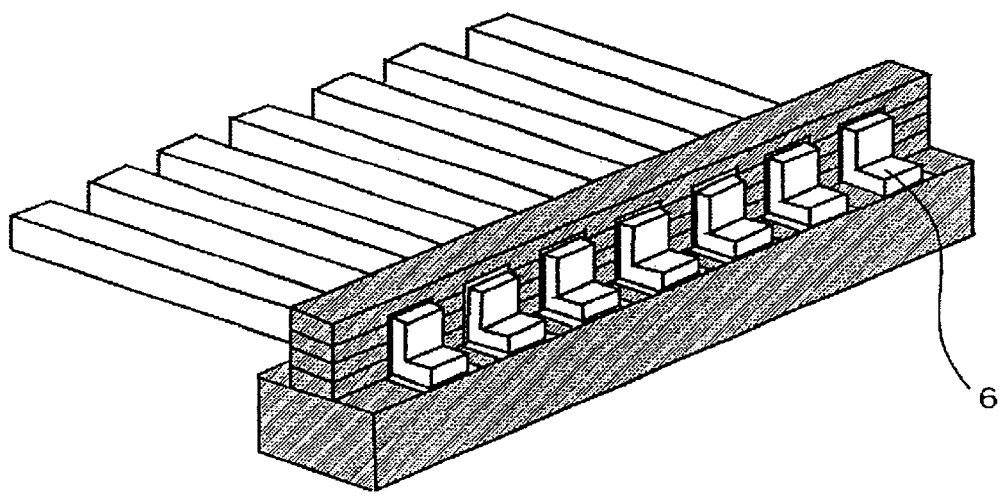
FIG. 5 is a perspective view showing the outward appearance and the inner side of the ceramic terminal member of an embodiment of the present invention.

In order to reduce the resistance of the other second wiring layer provided on the inside face of the enclosure, it is desirable that the inside face of the enclosure be provided with metal parts 6 having the shape of the letter L, as shown in FIG. 5. In this case, a bent portion of each metal part is connected to the first wiring layer, and the remaining straight portion of each metal part has a length so that it can reach the uppermost third wiring layer to be connected to every third wiring layer. In FIG. 5, all the wiring circuits have wiring strips in the third wiring layer and metal parts 6 having the shape of the letter L. However, as explained above, the number of metal parts having the shape of the letter L coincides with the number of wiring strips in the third wiring layer.

The hermetically sealing enclosure of the present invention is composed of the members made of the materials that have high thermal conductivity and a nominal difference in the coefficient of thermal expansion between them. An embodiment of the present invention is explained below as an example.

The base plate having an area for mounting photo-semiconductor devices is produced by using, for example, a copper-tungsten alloy or a copper-molybdenum alloy. The side-frame member that encloses the above-mentioned area is produced by using, for example, an iron-nickel-cobalt-family alloy.

The ceramic terminal member is produced by using a ceramic material such as aluminum nitride or aluminum oxide. The wiring strips in each wiring layer are provided on a ceramic sheet by printing a paste obtained by mixing an organic solvent and powders of high melting-point metals such as tungsten, molybdenum, and manganese. The printing is performed by the well-known screen-printing method. The wiring strips in the second wiring layers can also be provided by the following process: (a) Specified through holes are provided in a ceramic sheet. (b) The above-described paste containing a high melting-point metal is filled into the through holes. (c) The ceramic sheet is cut such that the through holes are divided at their centers. Thus, the required ceramic layers are prepared. Subsequently, the ceramic layers are laminated and subjected to pressurization to form a unified body. The unified body provided with the wiring strips made of a high melting-point metal is fired and sintered to complete the production of the ceramic terminal member.

Figure 6:
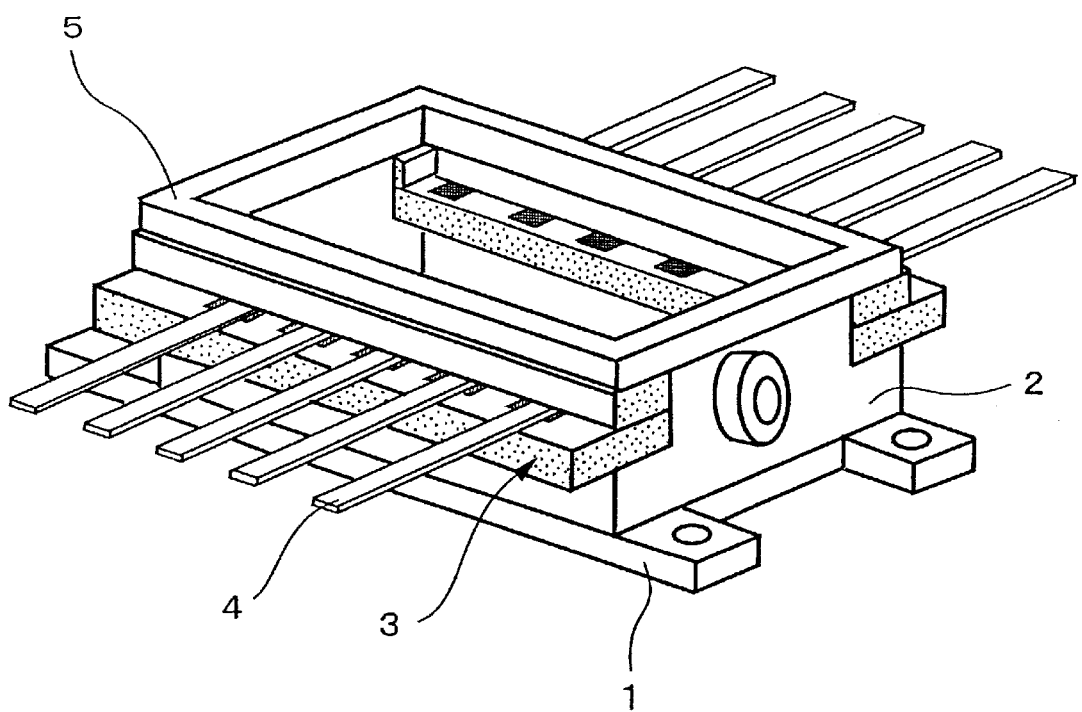
FIG. 6 is a single view drawing showing a conventional hermetically sealing enclosure for housing photo-semiconductor devices.

The seal ring 5 made of an iron-nickel-cobalt alloy is placed on the planar surface produced by the top surface of the ceramic terminal member 3 and the top surface of the side-frame member 2 having the front side frame (see FIG. 6). A sealing cover to be placed on the seal ring 5 is provided. The metal parts 6 having the shape of the letter L are provided on the inside of the ceramic terminal member. The external leads 4 having an increased thickness or having the shape of the letter L are provided. These constituting members except the sealing cover are assembled by the silver-brazing method to complete the production of the hermetically sealing enclosure for housing photo-semiconductor devices. It is desirable that the L-shaped metal parts and the external leads be made of oxygen-free copper, a copper matrix in which alumina is dispersed, or a clad material in which copper is sandwiched between iron-nickel-cobalt alloys.

A photo-semiconductor module is completed by the following steps: (a) At least one photo-semiconductor device is housed in the hermetically sealing enclosure produced by the above-described method. (b) An optical fiber is coupled with the device. (c) The sealing cover is placed on the seal ring to hermetically seal the enclosure.

Various hermetically sealing enclosures were produced with various structures by the above-described method. The electrical resistance of wiring strips provided at the ceramic terminal member was measured between the outside and inside of the enclosure. The resistance of the wiring strip having the conventional structure shown in FIG. 1 was 10.7 mΩ. The wiring strip was formed by using a tungsten paste. After the firing, the wiring strip had a width of 1.5 mm and a thickness of 10 μm.

An embodiment (Example 1) of the present invention formed a wiring circuit having a parallel-connected circuit composed of two second wiring layers and one third wiring layer, as shown in FIG. 2. The resistance of the wiring circuit was 6.8 mΩ. The wiring strip was formed by using a tungsten paste. The wiring strip had a width of 1.5 mm and a thickness of 10 μm. The second ceramic layer on which the second wiring layers were formed had a thickness of 0.5 mm.

In another embodiment (Example 2), as shown in FIG. 3, a sample having one third wiring layer prepared in Example 1 was used, and an external lead 4 made of oxygen-free copper was connected by silver-brazing. The external lead had a width of 1.5 mm and a thickness of 1 mm. In this case, the resistance was reduced to 5.3 mΩ.

In yet another embodiment (Example 3), as shown in FIG. 4, three third wiring layers were provided with their intervals of 0.5 mm, and an L-shaped external lead 4 made of oxygen-free copper was connected, with other conditions remaining the same as in Example 1. The external lead had a width of 1.5 mm and a thickness of 300 μm. In this case, the resistance was reduced to 3.2 mΩ. which is about one-third the resistance obtained by the conventional structure.

In yet another embodiment (Example 4), as shown in FIG. 5, an L-shaped metal part 6 made of oxygen-free copper was connected at the inside of the enclosure prepared in Example 3. The metal part had a width of 1.5 mm and a thickness of 300 μm. In this case, the resistance was reduced to 2.1 mΩ, which is about one-fifth the resistance obtained by the conventional structure.

In Examples 1 to 4, the third wiring layer was composed of either a single layer or three layers. However, the number of third wiring layers may be determined by considering the targeted resistance and assembling man-hour.

L-shaped external leads and metal parts were prepared by providing an etched line at the place of bending by the half-etching method before the bending was performed. As described above, the external leads were produced by using oxygen-free copper. However, when an external lead made of oxygen-free copper is silver-brazed onto a wiring strip, the external lead may suffer a strength reduction due to the crystal-grain growth in the copper, depending on the conditions. If this possibility cannot be ignored, it is desirable to use in place of the oxygen-free copper either a copper matrix in which alumina is dispersed or a clad material in which copper is sandwiched between iron-nickel-cobalt alloys. Considering this possibility, samples incorporating external leads made of these alternative materials were prepared to measure the resistance. The measured results demonstrated that the alternative materials showed resistances comparable to the resistance obtained in the case of oxygen-free copper. For example, when a sample similar to that prepared in Example 2 was prepared by using a copper matrix in which alumina is dispersed, the obtained resistance was 5.4 mΩ, which is nearly equal to 5.3 mΩ obtained in Example 2.

A photo-semiconductor module is completed by the following steps: (a) At least one photo-semiconductor device is housed in the hermetically sealing enclosure produced by the above-described method. (b) An optical fiber is coupled with the device. (c) The sealing cover is placed on the seal ring to hermetically seal the enclosure.

What is claimed is:

1. A hermetically sealing enclosure for housing photo-semiconductor devices, the enclosure comprising:
   (a) a base plate having an area for mounting photo-semiconductor devices;
   (b) a side-frame member bonded on the base plate such that the side-frame member encloses the area for mounting photo-semiconductor devices;
   (c) a ceramic terminal member incorporated into the side-frame member such that the top surface of the ceramic terminal member and the top surface of the side-frame member produce a planar surface;
   (d) a first wiring layer that:
      (d1) comprises a plurality of wiring strips; and
      (d2) penetrates through the ceramic terminal member;
   (e) a second wiring layer (hereinafter referred to as the second wiring layer) that:
      (e1) comprises at least one wiring strip;
      (e2) is connected to the first wiring layer at the outside of the ceramic terminal member; and
      (e3) stretches upward;
   (f) another second wiring layer (hereinafter referred to as the other second wiring layer) that:
      (f1) comprises at least one wiring strip;
      (f2) is connected to the first wiring layer at the inside of the ceramic terminal member; and
      (f3) stretches upward;
   (g) at least one third wiring layer that:
      (g1) comprises at least one wiring strip;
      (g2) connects the second wiring layer and the other second wiring layer;
      (g3) penetrates through the ceramic terminal member via a pathway insulated from the first wiring layer; and
      (g4) is insulated from the other third wiring layers when more than one third wiring layer is used;
   (h) a means for securely holding an optical fiber, the means being provided at the side-frame member;
   (i) a seal ring placed on the planar surface produced by the top surface of the ceramic terminal member and the top surface of the side-frame member;
   (j) a sealing cover placed on the top surface of the seal ring; and
   (k) a plurality of external leads connected to the wiring strips in the first wiring layer at the outside of the enclosure.

2. The hermetically sealing enclosure as defined in claim 1, wherein:
   (a) the external leads include at least one external lead (hereinafter referred to as an external lead AA) having a thickness larger than the distance between the first wiring layer and the third wiring layer or the uppermost third wiring layer;
   (b) the external lead AA or each external lead AA is connected to a wiring strip in the first wiring layer, the wiring strip being connected to a wiring strip in the second wiring layer; and
   (c) the external lead AA or each external lead AA is connected to the third wiring layer or every third wiring layer.

3. The hermetically sealing enclosure as defined in claim 1, wherein:
   (a) the external leads include at least one external lead (hereinafter referred to as an external lead BB) having the shape of the letter L;

(b) the external lead BB or each external lead BB is connected to a wiring strip in the first wiring layer, the wiring strip being connected to a wiring strip in the second wiring layer;

(c) the bent shorter portion of the external lead BB or each external lead BB has a length larger than the distance between the first wiring layer and the third wiring layer or the uppermost third wiring layer; and (d) the bent shorter portion of the external lead BB or each external lead BB is connected to the or every third wiring layer.

4. The hermetically sealing enclosure as defined in claim 1, wherein:

(a) the enclosure further comprises at its inside at least one metal part having the shape of the letter L;

(b) a bent portion of the metal part or each metal part is connected to a wiring strip in the first wiring layer, the wiring strip being connected to a wiring strip in the other second wiring layer;

(c) the remaining straight portion of the or each metal part has a length larger than the distance between the first wiring layer and the third wiring layer or the uppermost third wiring layer; and (d) the remaining straight portion of the metal part or each metal part is connected to the third wiring layer or every third wiring layer.

5. The hermetically sealing enclosure as defined in claim 2, wherein:

(a) the enclosure further comprises at its inside at least one metal part having the shape of the letter L;

(b) a bent portion of the metal part or each metal part is connected to a wiring strip in the first wiring layer, the wiring strip being connected to a wiring strip in the other second wiring layer;

(c) the remaining straight portion of the metal part or each metal part has a length larger than the distance between the first wiring layer and the third wiring layer or the uppermost third wiring layer; and (d) the remaining straight portion of the metal part or each metal part is connected to the third wiring layer or every third wiring layer.

6. The hermetically sealing enclosure as defined in claim 3, wherein:

(a) the enclosure further comprises at its inside at least one metal part having the shape of the letter L;

(b) a bent portion of the metal part or each metal part is connected to a wiring strip in the first wiring layer, the wiring strip being connected to a wiring strip in the other second wiring layer;

(c) the remaining straight portion of the metal part or each metal part has a length larger than the distance between the first wiring layer and the third wiring layer or the uppermost third wiring layer; and (d) the remaining straight portion of the metal part or each metal part is connected to the third wiring layer or every third wiring layer.

7. The hermetically sealing enclosure as defined in claim 1, wherein the external leads are made of one material selected from the group consisting of oxygen-free copper, a copper matrix in which alumina is dispersed, and a clad material in which copper is sandwiched between iron-nickel-cobalt alloys.

8. The hermetically sealing enclosure as defined in claim 2, wherein the external leads are made of one material selected from the group consisting of oxygen-free copper, a copper matrix in which alumina is dispersed, and a clad material in which copper is sandwiched between iron-nickel-cobalt alloys.

9. The hermetically sealing enclosure as defined in claim 3, wherein the external leads are made of one material selected from the group consisting of oxygen-free copper, a copper matrix in which alumina is dispersed, and a clad material in which copper is sandwiched between iron-nickel-cobalt alloys.

10. The hermetically sealing enclosure as defined in claim 4, wherein the metal part or each metal part having the shape of the letter L is made of one material selected from the group consisting of oxygen-free copper, a copper matrix in which alumina is dispersed, and a clad material in which copper is sandwiched between iron-nickel-cobalt alloys.

11. The hermetically sealing enclosure as defined in claim 5, wherein the metal part or each metal part having the shape of the letter L is made of one material selected from the group consisting of oxygen-free copper, a copper matrix in which alumina is dispersed, and a clad material in which copper is sandwiched between iron-nickel-cobalt alloys.

12. The hermetically sealing enclosure as defined in claim 6, wherein the metal part or each metal part having the shape of the letter L is made of one material selected from the group consisting of oxygen-free copper, a copper matrix in which alumina is dispersed, and a clad material in which copper is sandwiched between iron-nickel-cobalt alloys.

13. The photo-semiconductor module comprising a hermetically sealing enclosure as defined in claim 1.

14. The photo-semiconductor module comprising a hermetically sealing enclosure as defined in claim 2.

15. The photo-semiconductor module comprising a hermetically sealing enclosure as defined in claim 3.

16. The photo-semiconductor module comprising a hermetically sealing enclosure as defined in claim 4.

17. The photo-semiconductor module comprising a hermetically sealing enclosure as defined in claim 5.

18. The photo-semiconductor module comprising a hermetically sealing enclosure as defined in claim 6.

19. The photo-semiconductor module comprising a hermetically sealing enclosure as defined in claim 7.

20. The photo-semiconductor module comprising a hermetically sealing enclosure as defined in claim 8.

21. The photo-semiconductor module comprising a hermetically sealing enclosure as defined in claim 9.

22. The photo-semiconductor module comprising a hermetically sealing enclosure as defined in claim 10.

23. The photo-semiconductor module comprising a hermetically sealing enclosure as defined in claim 11.

24. The photo-semiconductor module comprising a hermetically sealing enclosure as defined in claim 12.

* * * * *